United States Patent [19]
Okamoto

[11] Patent Number: 5,896,423
[45] Date of Patent: Apr. 20, 1999

[54] SPREAD SPECTRUM SIGNAL RECEIVER

[75] Inventor: Naoki Okamoto, Chiba, Japan

[73] Assignee: Sharp Kabushiki Kaisha, Osaka, Japan

[21] Appl. No.: 08/782,668

[22] Filed: Jan. 15, 1997

[30]     Foreign Application Priority Data

Jan. 19, 1996  [JP]  Japan ..................... 8-007009

[51] Int. Cl.$^6$ ............................................. H04L 27/08
[52] U.S. Cl. ................... 375/345; 375/345; 375/200; 375/208
[58] Field of Search ............................ 375/200, 208, 375/367, 343, 345, 340; 330/279, 280; 348/572; 455/234.1, 240.1

[56]           References Cited

U.S. PATENT DOCUMENTS

| | | | |
|---|---|---|---|
| 4,656,630 | 4/1987 | Miyo | 370/104 |
| 5,347,534 | 9/1994 | Akazawa et al. | 375/200 |
| 5,347,537 | 9/1994 | Mori et al. | 375/208 |
| 5,659,582 | 8/1997 | Kojima et al. | 375/345 |
| 5,745,531 | 4/1998 | Sawahashi et al. | 375/345 |

*Primary Examiner*—Stephen Chin
*Assistant Examiner*—Shuwang Liu

[57]            ABSTRACT

The amplitude level of a received signal is controlled by a variable gain amplifier and the amplitude level controlled received signal is converted to a digital signal by an A/D converter. Correlation or demodulation of the digitally converted signal is then established by a correlator. A correlated output comparator compares an output signal from the correlator with a prescribed threshold value to establish correlated synchronization using the output signal form the correlator and performs initial synchronization using the comparison output. The output amplitude level of the variable gain amplifier is controlled in accordance with an output amplitude from the correlator. The gain of the variable gain amplifier is switched to the maximum value by a switch dependent on presence of a synchronization establishment signal for the correlation synchronizing circuit.

28 Claims, 15 Drawing Sheets

CORRELATION
SPIKE

OUTPUT FROM
CORRELATED
OUTPUT
COMPARATOR

FILTER
OUTPUT

1

SPREAD SPECTRUM SIGNAL RECEIVER

BACKGROUND OF THE INVENTION

1. Field of the Invention

The present invention relates to a spread spectrum signal receiver. More specifically, the present invention relates to a spread spectrum signal receiver in which the data spectrum is spread by a spread code and transmitted in broad band.

2. Description of the Background Art

Communication using a narrow band modulation system has been conventionally used in the field of data communication. Such a system is advantageous in that demodulation at the receiver can be carried out by relatively small circuitry. However, it has a disadvantage that performance degrades because of multipath fading in an environment having multiple paths such as in a room (office, factory or the like).

By contrast, in a spread spectrum communication system, the spectrum of data is spread by a spread code and the data is transmitted in a broad band. Therefore, it is resistant against such frequency selective fading, and therefore the aforementioned disadvantage of narrow band communication can be eliminated. In order to implement digital processing in such a system, an A/D converter is used so that the data is converted and processed in the form of digital signals.

A conventional example of the receiver will be described with reference to the block diagram of FIG. 1. A signal from an input terminal 1 is amplified by a variable gain amplifier 2, passed through an A/D converter 3 and input to a correlator 4. An output from correlator 4 is input to a synchronizing circuit 6, and correlation synchronization is established at the correlated timing. By using a correlation synchronization pulse indicating the correlated and synchronized timing, the correlated output at that time is compared with an optimally set threshold value by a correlated output comparator 5, the output from comparison is smoothed by a filter 7, and thereafter it is applied to variable gain amplifier 2 so that the gain is controlled. In this manner, the maximum point where correlated output matches (hereinafter referred to as correlation spike) is always kept constant.

In order to fully make use of the performance of the receiver, the desired signal level to be input to A/D converter 3 has an optimal value, and it is not the case that any signal level may be input. The optimal value is known as the optimal quantization interval and in accordance with this interval, the signal amplitude of the input to A/D converter 3 must be optimized by means of variable gain amplifier 2. However, it is difficult to control the amplitude of the signal input to A/D converter 3 to be optimal by variable gain amplifier 2. Therefore, instead, the correlation spike is controlled such that it is kept constant.

If optimal signal amplitude is established, the amplitude of the correlation spike is constant. In other words, by controlling the gain of the variable gain amplifier 2 such that the amplitude of correlation spike is kept constant, the input signal comes to have an optimal amplitude, that is, optimal quantization interval is obtained, and hence the receiver comes to have best performance.

The operation in a steady state period will be described with reference to FIGS. 2A to 2C. In correlated output comparator 5, correlation spike P shown in FIG. 2A is compared with a threshold value E which is set in advance. Amplitude of correlation spike P varies from time to time. Meanwhile, the threshold value E is the optimal amplitude of the correlation spike. By comparing these two, a difference signal is output. The difference signal is as shown in FIG. 2B. By filtering the difference signal by a filter 7, a waveform shown in FIG. 2C is obtained. The waveform is determined by a constant of filter 7.

The purpose of filter 7 is to average variation caused by noise. By controlling variable gain amplifier 2 using the thus obtained output, the gain of amplifier 2 is lowered when correlated spike P is larger than the threshold value E, and the gain of amplifier 2 is increased when correlation spike P is smaller than the threshold value E. Feedback control is thus realized, whereby the peak of the correlation spike P is kept always matching the set threshold value E.

However, at the start of communication, correlation is not established. Therefore, the correlation synchronization pulse from synchronizing circuit 6 is generated not at the correct position of the correlation spike P. Therefore, in that case, correlated output comparator 5 compares the output with the threshold value E regardless of whether it is a correlation spike or not, and using the resulting difference signal, the variable gain amplifier 2 is controlled.

Now, let us consider the operation of the synchronizing circuit 6. In synchronizing circuit 6, of an initial synchronizing circuit and a synchronization protecting circuit constituting the synchronizing circuit 6, first, the initial synchronizing circuit operates to establish synchronization. Thereafter, synchronization is maintained by the synchronization protecting circuit. In this manner, the correlation synchronization pulse point is controlled such that it always appears at the correlation spike P. The initial synchronizing circuit compares an input signal with a set threshold value (the threshold provided for the synchronizing circuit 6 and not shown in FIG. 1), and if the input signal is higher, it assumes that the input signal is the correlation spike P. By repeating this operation several times at the same timing, synchronization is established.

However, in the conventional example, before initial synchronization is established, amplification rate of the variable gain amplifier 2 is unknown, and hence the signal amplitude entering A/D converter 3 is also unknown. This means that the amplitude of correlation spike P is also unknown. This makes it difficult to set the threshold value of the initial synchronizing circuit. Accordingly, there is a method for initial synchronization in which variable gain amplifier 2 is subjected to automatic gain control (AGC) so that the output signal from variable gain amplifier 2 is kept constant.

FIG. 3 shows this structure. Basically, this structure is the same as FIG. 1, except that an AGC circuit 8 is provided at the output of variable gain amplifier 2 for detecting power from the output and for keeping constant the amplitude. AGC circuit 8 is equivalent to any AGC circuit used in general communication equipment. In the structure shown in FIG. 3, at the time of initial synchronization, a switch 9 is switched so that the amplitude of the output from variable gain amplifier 2 is kept constant by the output from AGC circuit 8, and after initial synchronization is established, the variable gain amplifier 2 is controlled referring to the correlated output as shown in FIG. 1. This switching is performed using a synchronization flag FLG output from synchronizing circuit 6, indicating whether or not initial synchronization is established.

However, the conventional circuit is disadvantageous in that it requires additional AGC circuit 8. Though AGC circuit 8 can be implemented by a capacitor or a diode for detection, an analog filter or the like, these elements are all analog devices having large circuit scale and not suitable for integration.

SUMMARY OF THE INVENTION

An object of the present invention is to provide a spread spectrum signal receiver having a simple structure and capable of stably performing initial synchronization.

Briefly stated, in the present invention, the received signal is amplified by a variable gain amplifier, an output signal from the amplifier is converted to a digital signal by a converting circuit, correlation between the value which has been converted to the digital signal and a spread code is found by a correlator, in order to establish correlated synchronization by using a correlated output, a predetermined threshold value and the correlated output are compared by a correlation synchronization circuit so that initial synchronization is established and thereafter synchronization is maintained, the level of an output amplitude of the variable gain amplifier is controlled based on the amplitude of the correlator in response to the establishment of synchronization, and gain of the variable gain amplifier is switched to the maximum gain dependent on presence/ absence of a synchronization establishment signal.

Therefore, in the present invention, the variable gain amplifier is switched to the maximum gain dependent on presence/absence of the synchronization establishment signal, so that the signal amplitude at the time of initial synchronization can be kept at the maximum value.

In a preferred embodiment, a holding circuit is provided for holding the output amplitude value output from the gain control circuit while synchronization is maintained as a gain control value, and the gain of the variable gain amplifier is controlled by the held gain control value. Therefore, in this embodiment, when the synchronization establishment signal is generated by the correlation synchronizing circuit, the control value held from the maximum gain can be set again, and therefore at the time of air link disconnection, a value before disconnection can be readily recovered.

In a more preferred embodiment of the present invention, the gain control value held by the holding circuit is resettable. Therefore, in the preferred embodiment, the value is not always returned to the state before disconnection but it can be changed in accordance with an instruction from an upper layer, such as a protocol.

More preferably, a filter for smoothing the output from the gain control circuit is provided, and the time constant of the filter is made variable. Therefore, in the more preferred embodiment, time for convergence to the transitional state period can be made shorter by varying the time constant.

Further, in a more preferred embodiment, by changing the threshold value in a transitional state in the correlation synchronizing circuit, the performance of the synchronization protecting circuit in the transitional state can be improved.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The foregoing and other objects, features, aspects and advantages of the present invention will become more apparent from the following detailed description of the present invention when taken in conjunction with the accompanying drawings, which are illustrative only and thus are not limitative of the present invention and wherein.

DESCRIPTION OF THE PREFERRED EMBODIMENTS

Figure 1:
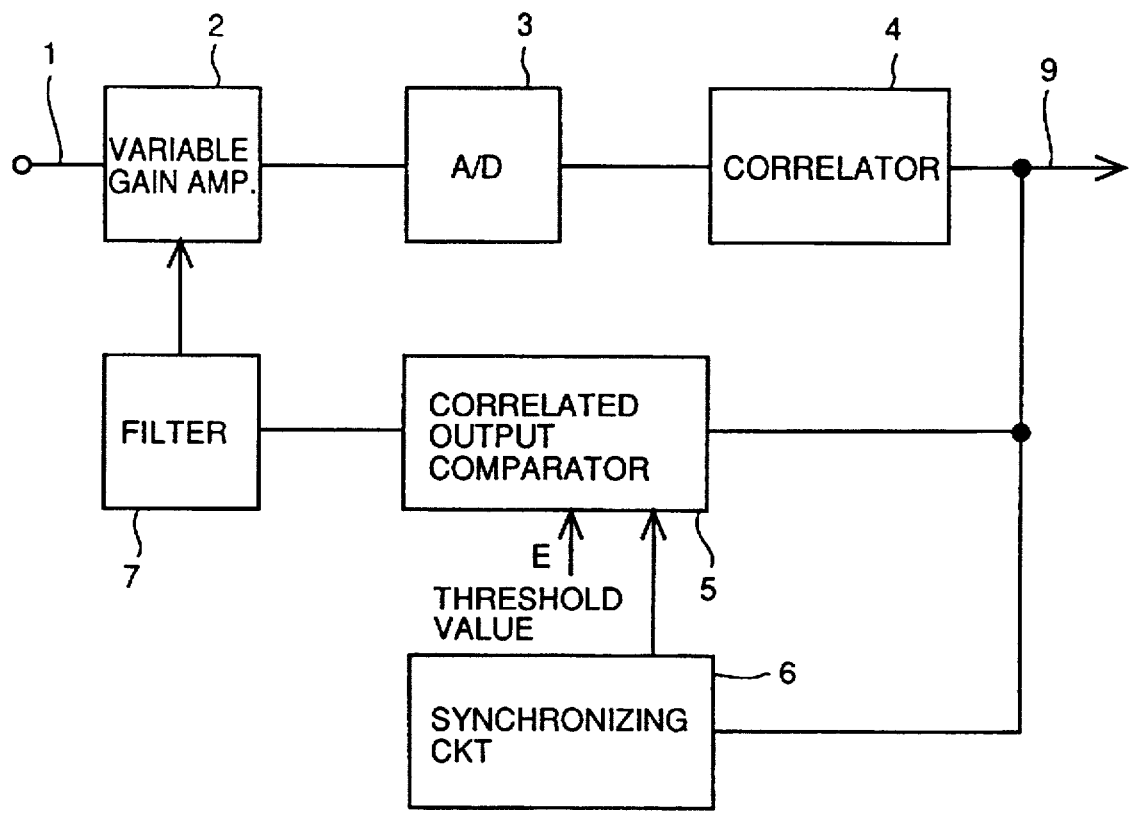
FIG. 1 is a circuit block diagram showing a conventional receiver.
Figure 2A:
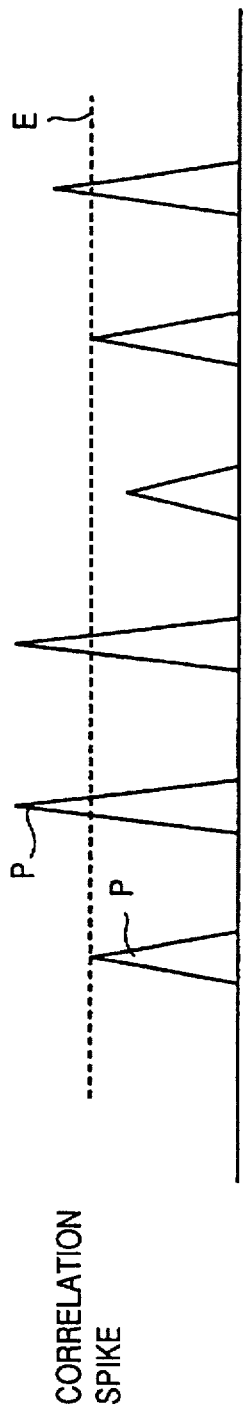
FIGS. 2A to 2C show operation of the conventional receiver, showing a correlated output, a comparison output and a filter output.
Figure 2B:
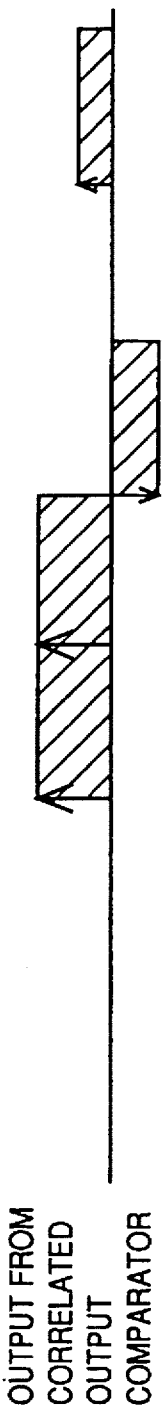
Figure 2C:

A first embodiment of the present invention will be described with reference to FIG. 4. This is a circuit block diagram showing the structure of the receiver. A signal from input terminal 11 is amplified by variable gain amplifier 12, converted to a digital signal by A/D converter 13 and input to correlator 14. An output signal from correlator 14 is input to correlated output comparator 15 as well as to synchronizing circuit 16.

In synchronizing circuit 16, correlated synchronization is established at the correlated timing. By using the correlated synchronized pulse indicating the correlated and synchronized timing, the correlated output at that time and an optimally set threshold value E are compared by correlated output comparator 15 (compared and a difference signal therebetween is output). At this time, synchronization flag FLG output separately from synchronizing circuit 16 indicates synchronization. Therefore, switch 19 is switched such that the signal from correlated output comparator 15 is selected, in accordance with the flag FLG.

Accordingly, the comparison output from the correlated output comparator 15 controls, through switch 19 and filter 17, the gain of variable gain amplifier 12. In this manner, when synchronization is established, switch 19 passes the output value obtained by comparison to filter 17, so that the maximum point where correlated output matches (hereinafter referred to as the correlation spike) is always kept constant.

Figure 3:
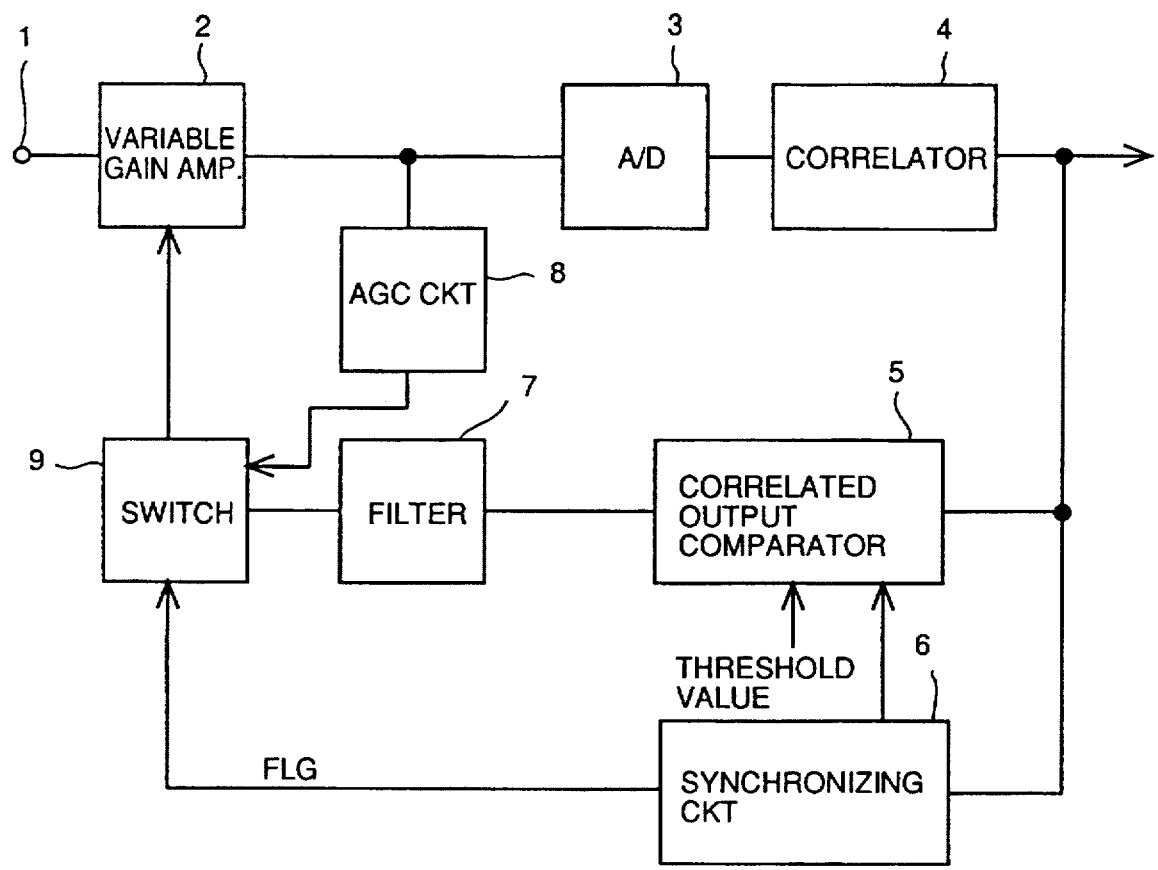
FIG. 3 is a circuit block diagram showing another conventional receiver.

Meanwhile, if initial synchronization is not established, that is, when the timing of the correlation spike is not determined and synchronization flag FLG does not indicate synchronization, switch 19 selects and outputs the value of maximum gain setting circuit 18 and passes it to filter 17. In the first embodiment, as compared with the conventional example shown in FIG. 1, switch 19 and maximum gain setting circuit 18 are necessary. However, these can be implemented in far simpler structure than AGC circuit 8 of FIG. 3.

The reason why initial synchronization can be established by setting the maximum gain will be described. In the present circuit structure, A/D converter 13 is used, which may generally have a resolution of 3 or 4 bits. It may have an analog input range of about 1 to about 2V, which voltage range is divided into 8 or 16 levels.

Figure 5A:
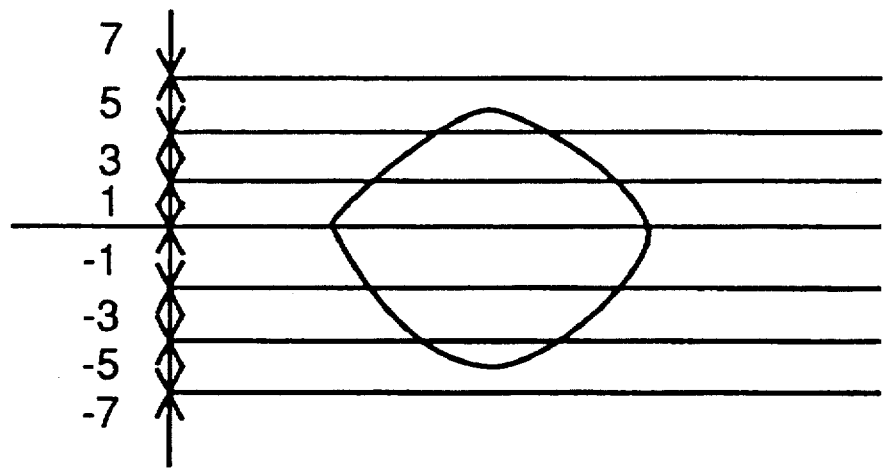
FIGS. 5A and 5B show quantization of an A/D converter in accordance with an embodiment of the present invention.
Figure 5B:
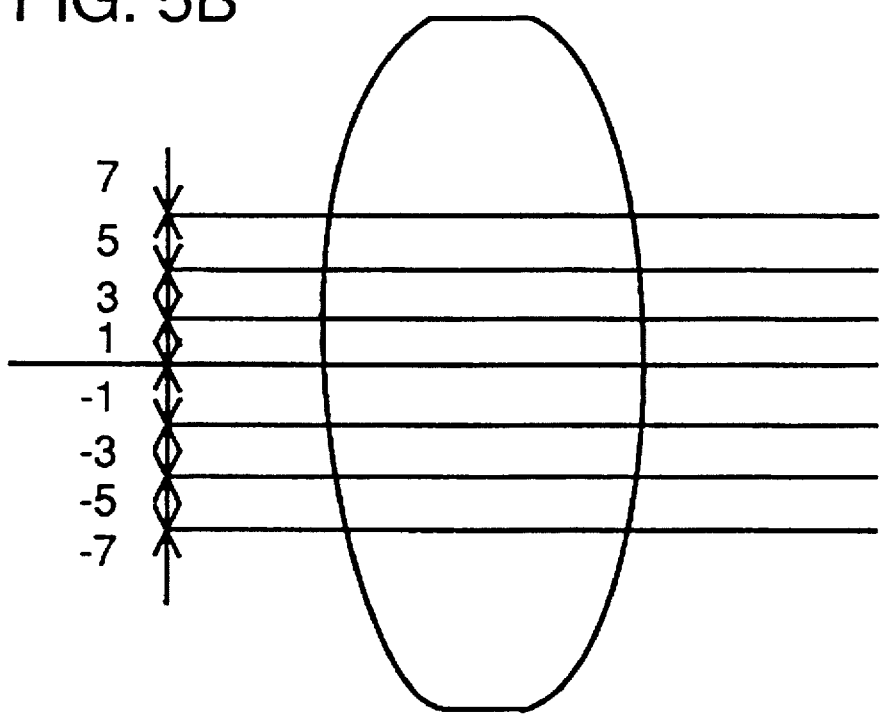

Such operation is shown in FIGS. 5A and 5B. FIG. 5A corresponds to the optimal amplitude. Here, an A/D converter of 3 bits is used, and the input range is divided into 8 levels. As for the magnitude of amplitude, the amplitude having such an amplitude corresponding to the eye pattern shown in the figure provides optimal characteristics. Meanwhile, FIG. 5B corresponds to the maximum amplification of variable gain amplifier 12, in which signal amplitude exceeds 8 levels and all quantized to −7 and 7.

In this case, different from the example of FIG. 5A, not the best performance is obtained with respect to error rate or the like. However, the input signal itself can be quantized to two values, that is, −7 and 7. Therefore, when the signal is spread by using 63 chips, for example, the maximum value of the correlated spike itself will be 63×7=441. Therefore, using this value as a reference, initial synchronization can be performed stably.

In this manner, in the present embodiment, until initial synchronization is established, the gain of variable gain amplifier 12 is set to the maximum, whereby initial synchronization can be performed stably with simple structure as compared with the prior art example. What is done by the maximum gain setting circuit 18 is simply to set the control voltage to the maximum value of variable gain amplifier 12, that is, to a fixed value of 5V, for example. Therefore, as compared with the conventional structure of FIG. 3, the circuit structure is quite simple.

Figure 6:
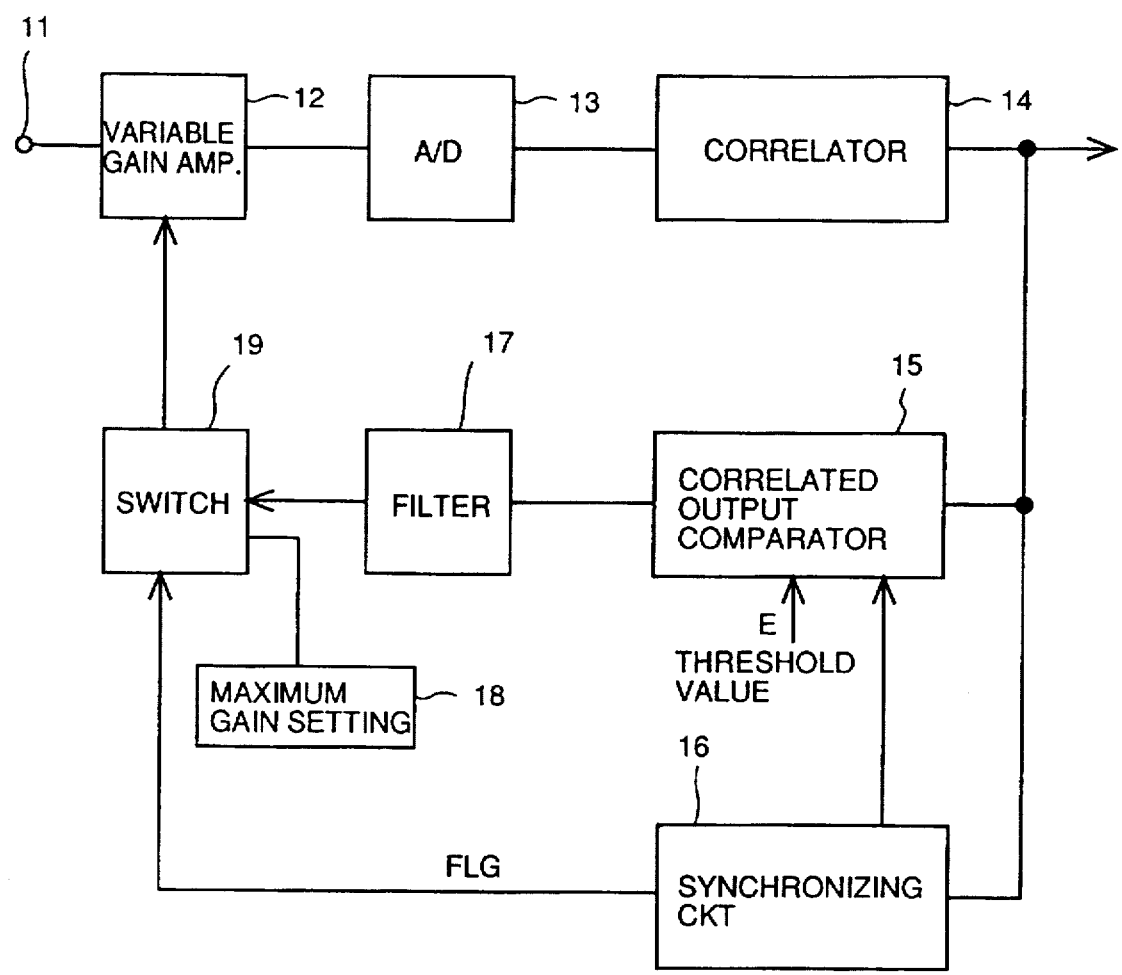
FIG. 6 is a circuit block diagram showing a receiver of a second embodiment of the present invention.

A second embodiment of the present invention will be described with reference to FIG. 6. In FIG. 6, portions corresponding to those of FIG. 4 are denoted by the same reference characters and description thereof is not repeated. In the present embodiment, switch 19 for switching to the maximum gain set value is connected in the succeeding stage of filter 17. In this structure, initial synchronization of correlation is, of course, performed at the start of communication. In addition, initial synchronization of correlation may be necessary dependent on the condition of communicating wireless transceivers, when the air link is disconnected, for example.

Figure 4:
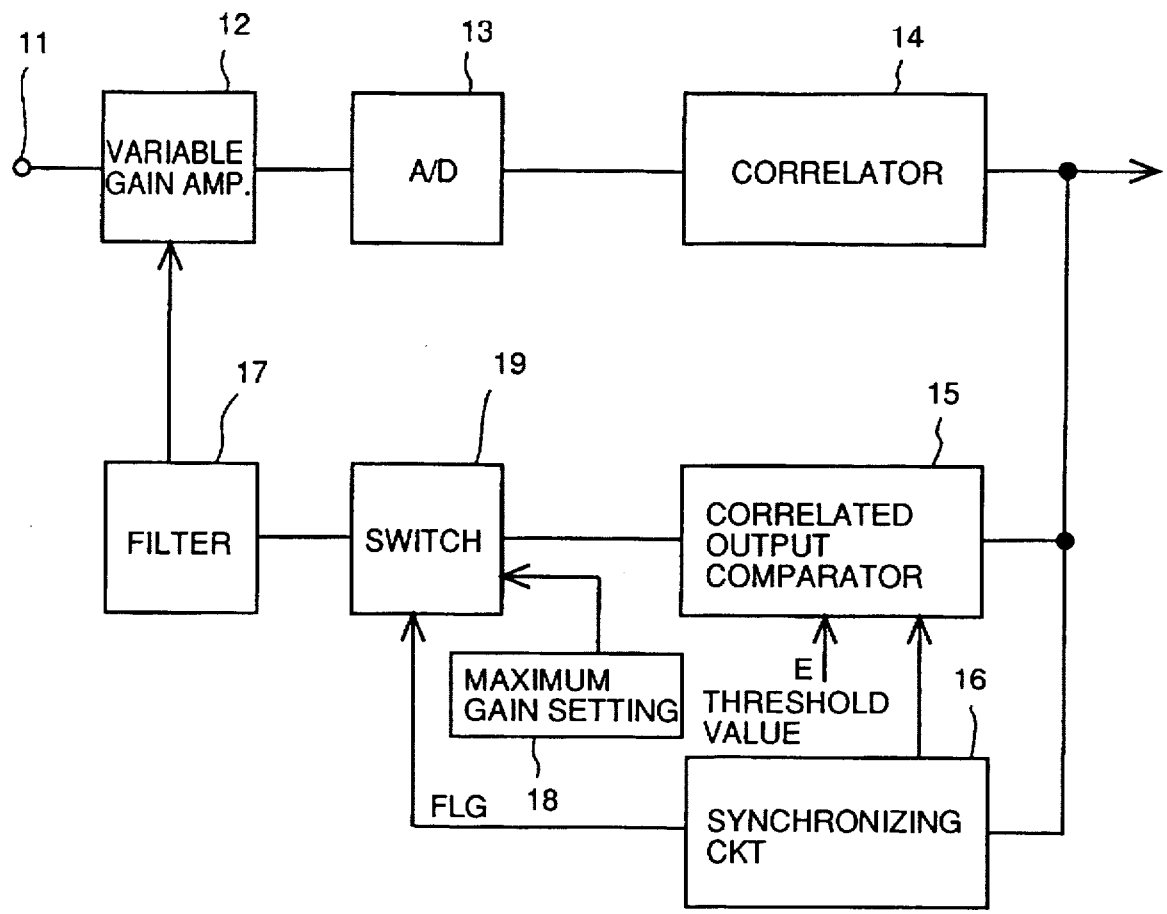
FIG. 4 is a circuit block diagram showing a receiver of a first embodiment of the present invention.
Figure 7A:
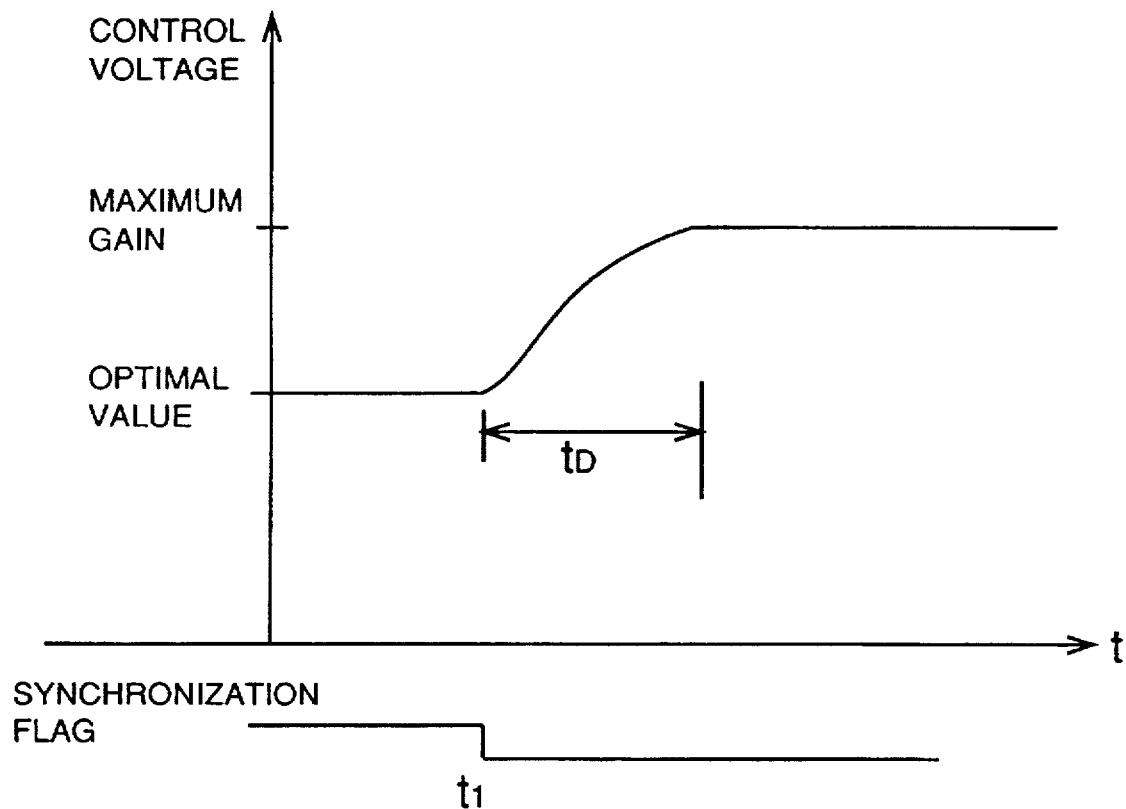
FIGS. 7A and 7B show control voltage of the variable gain amplifier in accordance with the second embodiment of the present invention.

In such a case, by the structure shown in FIG. 4, rise of the control voltage of variable gain amplifier 12 is delayed because of the influence of filter 17. The operation of the circuit shown in FIG. 4 is as shown in FIG. 7A. First, synchronization is established, and then air link is disconnected so that synchronization is lost, and the synchronization flag indicates off-synchronization at time point tl. Therefore, switch 19 switches to the value of maximum gain. However, because of the integrating characteristic of filter 17, the actual control voltage rises slowly, and attains the maximum gain after the delay of tD. As a result, reestablishment of synchronization (initial synchronization) is delayed.

Figure 7B:
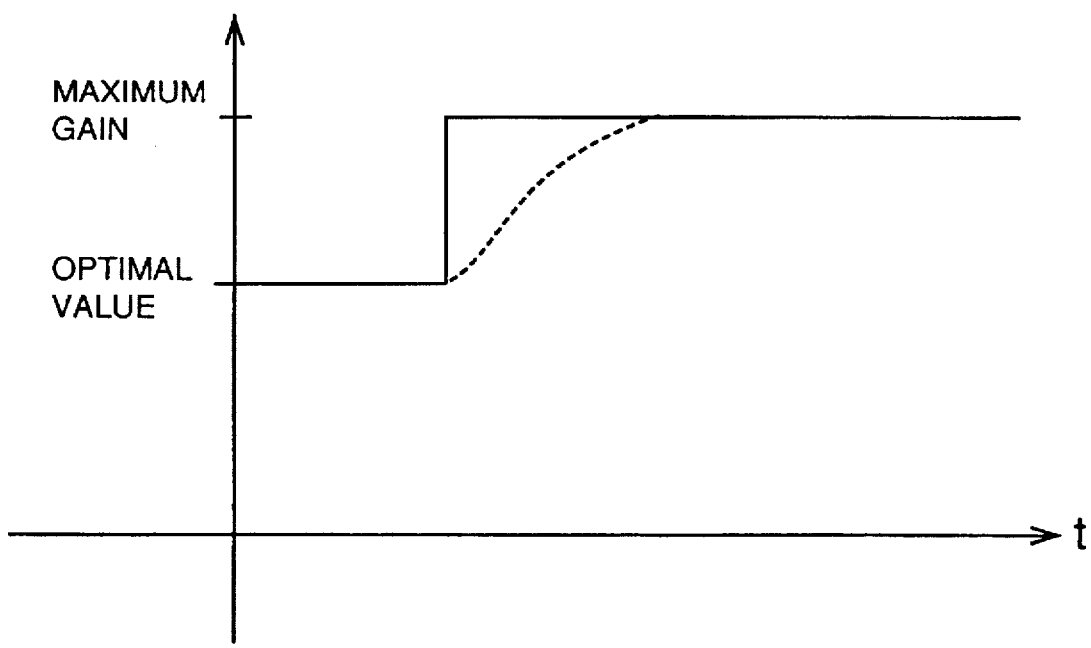

However, in the present embodiment (FIG. 6), since there is inserted switch 19 in the succeeding stage of filter 17, the rise of the output from filter 17 is as shown by the dotted line in FIG. 7B while the output from switch 19 is as shown by the solid line in FIG. 7B. Therefore, as compared with the first embodiment, reestablishment is possible in a shorter time period. As a result, when the air link is disconnected, the air link can be recovered faster.

Figure 8:
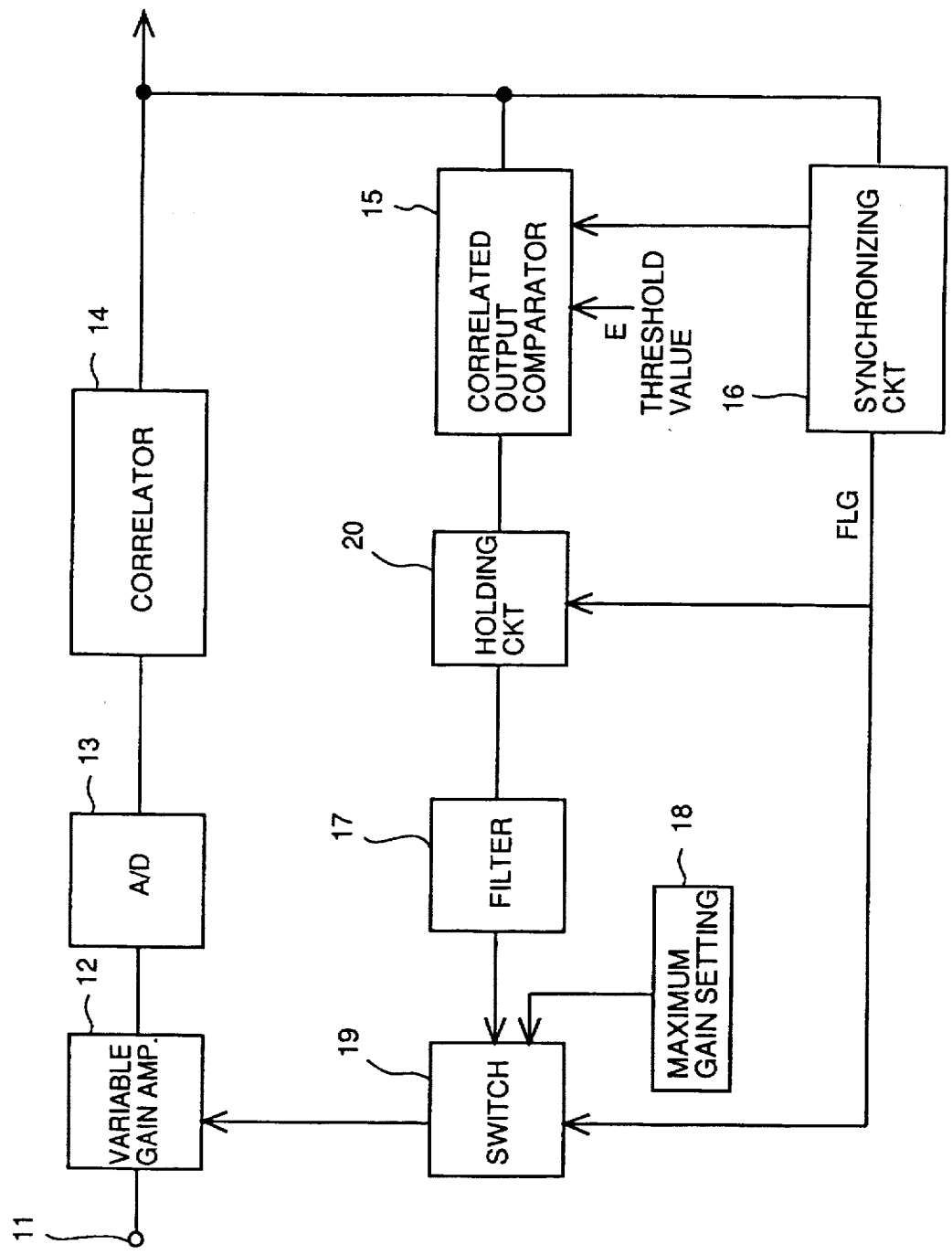
FIG. 8 is a block diagram showing a receiver of a third embodiment of the present invention.

A third embodiment of the present invention will be described with reference to FIG. 8. In the figure, portions similar to the second embodiment shown in FIG. 6 are denoted by the same reference characters and description thereof is not repeated. In the third embodiment, there is provided a holding circuit 20 in the preceding stage of filter 17. When flag FLG from synchronizing circuit 16 indicates off-synchronization, holding circuit 20 holds the comparison output from correlated output comparator 15 at that time and when said flag FLG indicates synchronization, applies the held value to filter 17, and in the synchronized state thereafter, passes the output from the correlated output comparator 15 directly to filter 17.

When the air link is disconnected as described above, synchronization flag FLG indicates off-synchronization, and the process for initial synchronization starts. When initial synchronization is established thereafter, the output from filter 17 is again supplied as control signal to variable gain amplifier 12. The difference in operation in that case when holding circuit 20 is provided and not provided will be described with reference to FIGS. 9A and 9B.

Figure 9A:
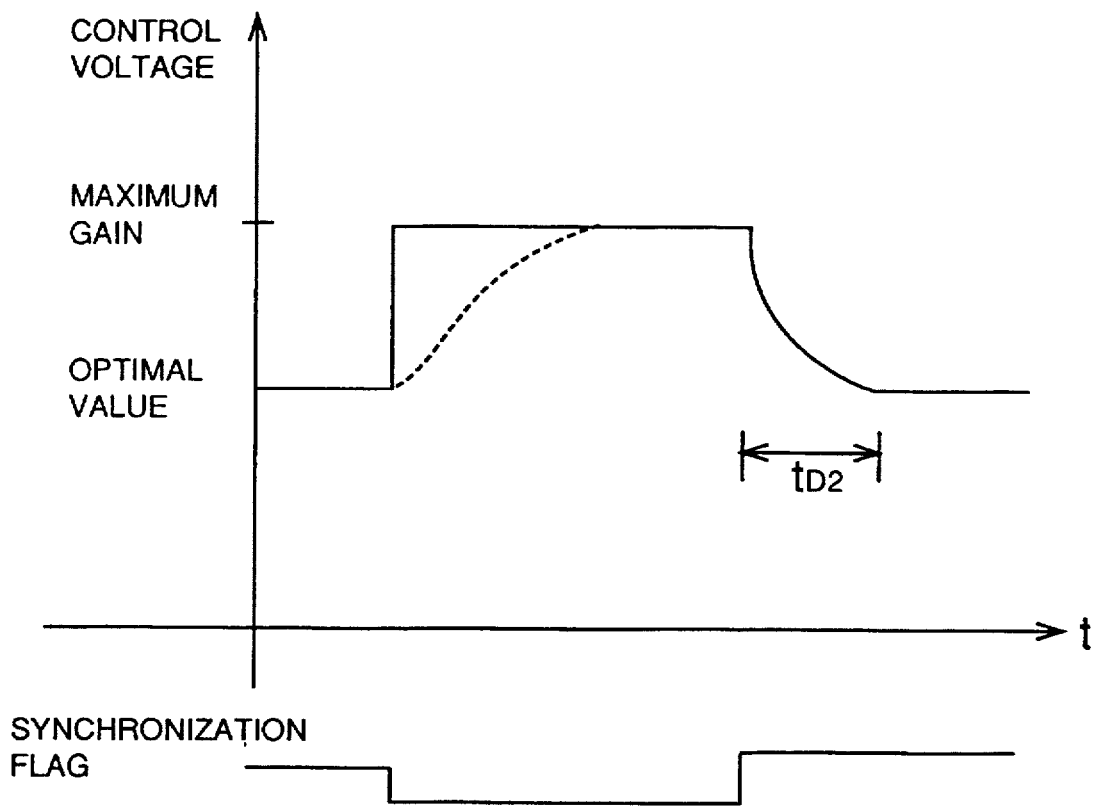
FIGS. 9A and 9B show control voltage of the variable gain amplifier in accordance with the third embodiment of the present invention.

FIG. 9A shows an example where holding circuit 20 is not provided. When synchronization is lost, the operation is similar to that shown in FIG. 7A, and control voltage is set to the maximum gain. However, when synchronization is reestablished, convergence to optimal value takes time, because of the integrating characteristic of filter 17. In this case, there is a delay of TD2 until convergence to maximum value is completed.

Figure 9B:
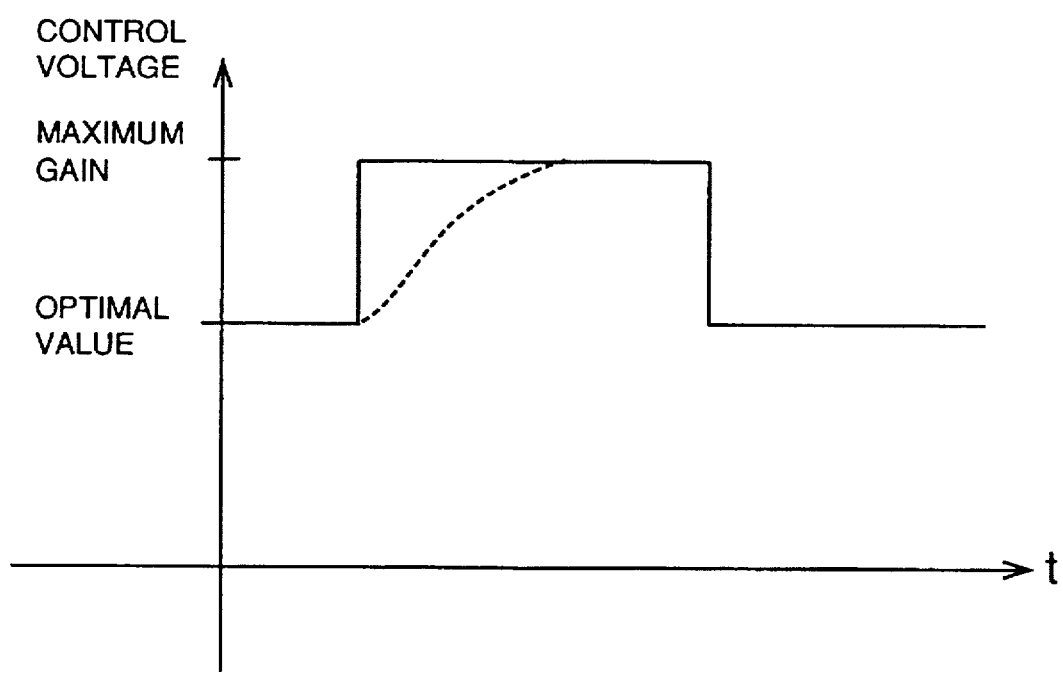

Therefore, in the third embodiment, the voltage of the optimal value at the moment when synchronization is lost is held in the holding circuit 20. Therefore, simultaneously with the reestablishment of synchronization, a level close to the optimal value can be obtained. This is shown in FIG. 9B. As a result, the delay tD2 can be made zero, and performance can be improved.

Figure 10:
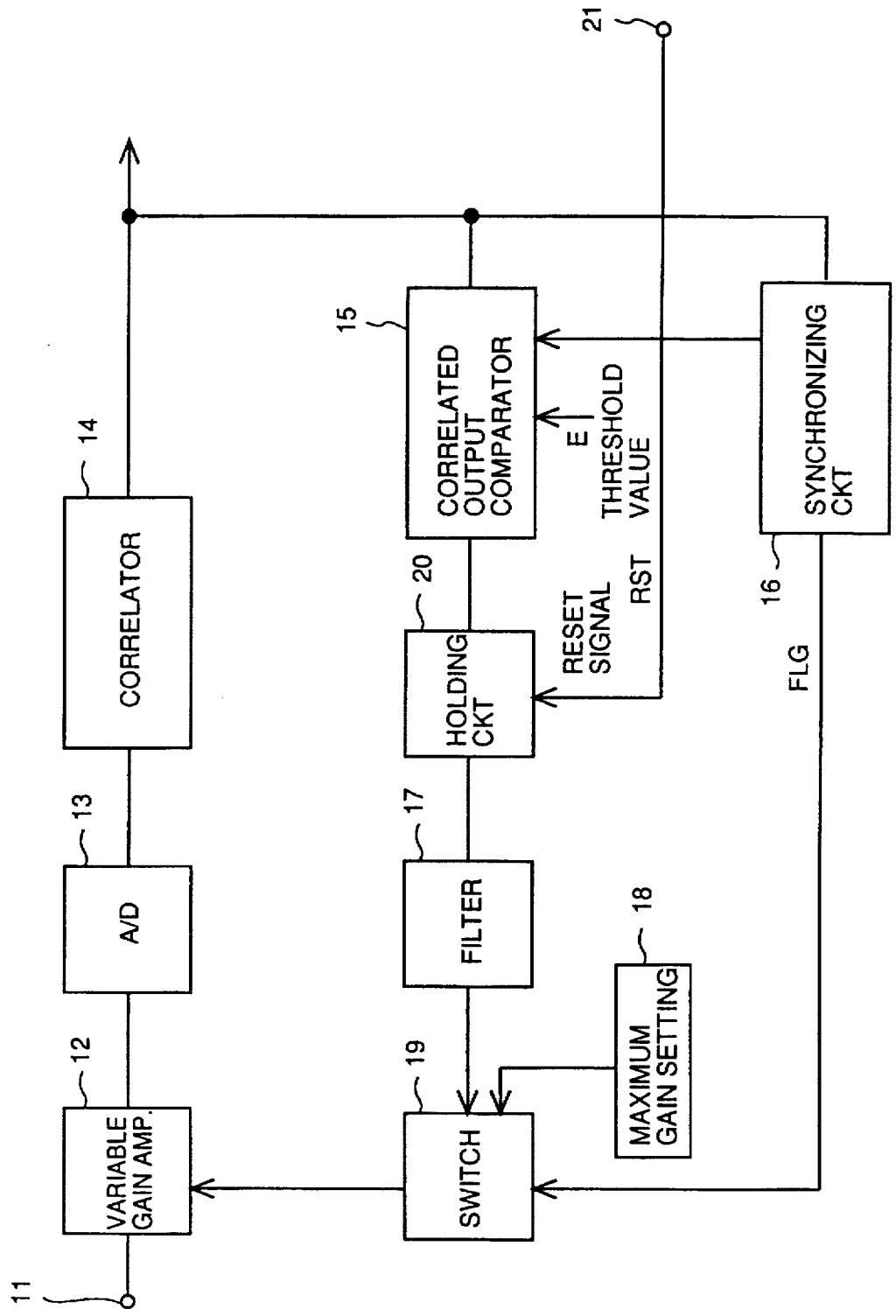
FIG. 10 is a circuit block diagram showing a receiver of a fourth embodiment of the present invention.

A fourth embodiment of the present invention will be described with reference to FIG. 10. Basically, the structure is the same as the third embodiment described above (FIG. 8). However, in the present embodiment, holding circuit 20 is adapted such that an external reset signal RST can be input through terminal 21. As described with reference to FIGS. 9A and 9B, when the air link is disconnected and synchronization is reestablished, convergence to the optimal point is possible at high speed thanks to the holding circuit 20. However, if the disconnected state continues long or at the time of initial synchronization, the value held previously will be meaningless. Therefore, a function of resetting using an external signal is provided.

Though it differs system by system, the reset signal RST may be generated using the length of the disconnected time as a reference, or generated using end of communication of one packet as a reference, by determining end of a data packet based on the demodulated data. In any case, the signal is provided from an upper layer (for example, a signal from a protocol).

A fifth embodiment of the present invention will be described with reference to FIG. 11. In the figure, portions corresponding to those of the second embodiment shown in FIG. 6 are denoted by the same reference characters and description thereof is not repeated. In the present embodiment, a time constant variable filter 17a is used as the filter and variable control thereof is performed by a filter controller 22 which outputs a control signal based on the synchronization flag FLG. The time constant of filter 17a is controlled by filter controller 22 in accordance with the time lapse from establishment of synchronization flag.

At the initial synchronization of correlation, the transitional time is determined by the time constant of filter 17a. At the time of disconnection, optimal value can be recovered quickly by using holding circuit 20 as in the third embodiment (FIG. 8). However, at the time of initial synchronization or when disconnection continues for a long period, the transitional time is still determined by the time constant of filter 17a.

Figure 12:
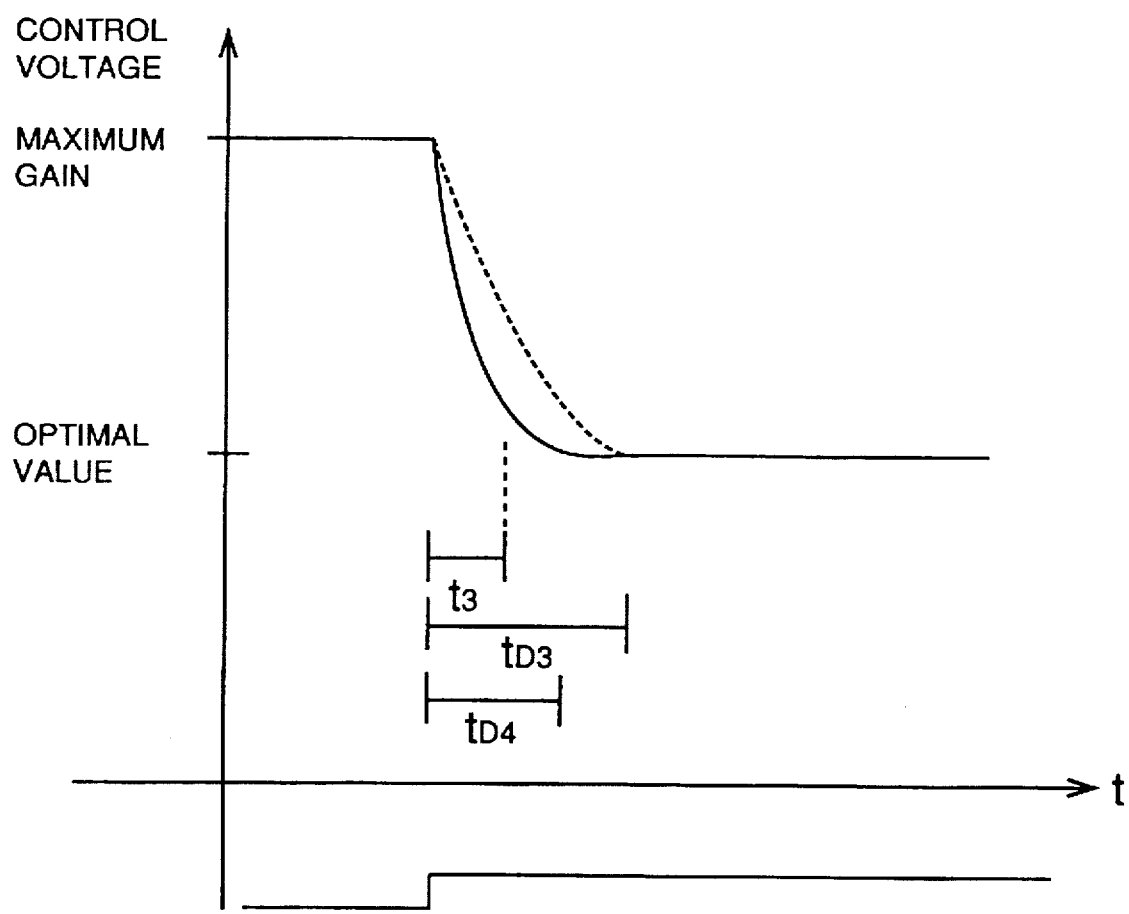
FIG. 12 shows control voltage of the variable gain amplifier in accordance with the fifth embodiment of the present invention.

This will be described with reference to FIG. 12. In the conventional filter, as shown by the dotted line in FIG. 12, the transitional characteristic is determined by a time constant which is kept constant normally. Therefore, a time tD3 is necessary to attain the steady state. Further, in the present embodiment, the time constant of filter 17a is switched in the time period t3, steady state can be attained in the time period tD4, and hence the speed of operation can be improved.

In this manner, by the present embodiment, in the initial establishment and in the transitional state, the time constant is set shorter to realize high speed synchronization, while in the steady state, the time constant is set longer to enable stable operation.

Figure 11:
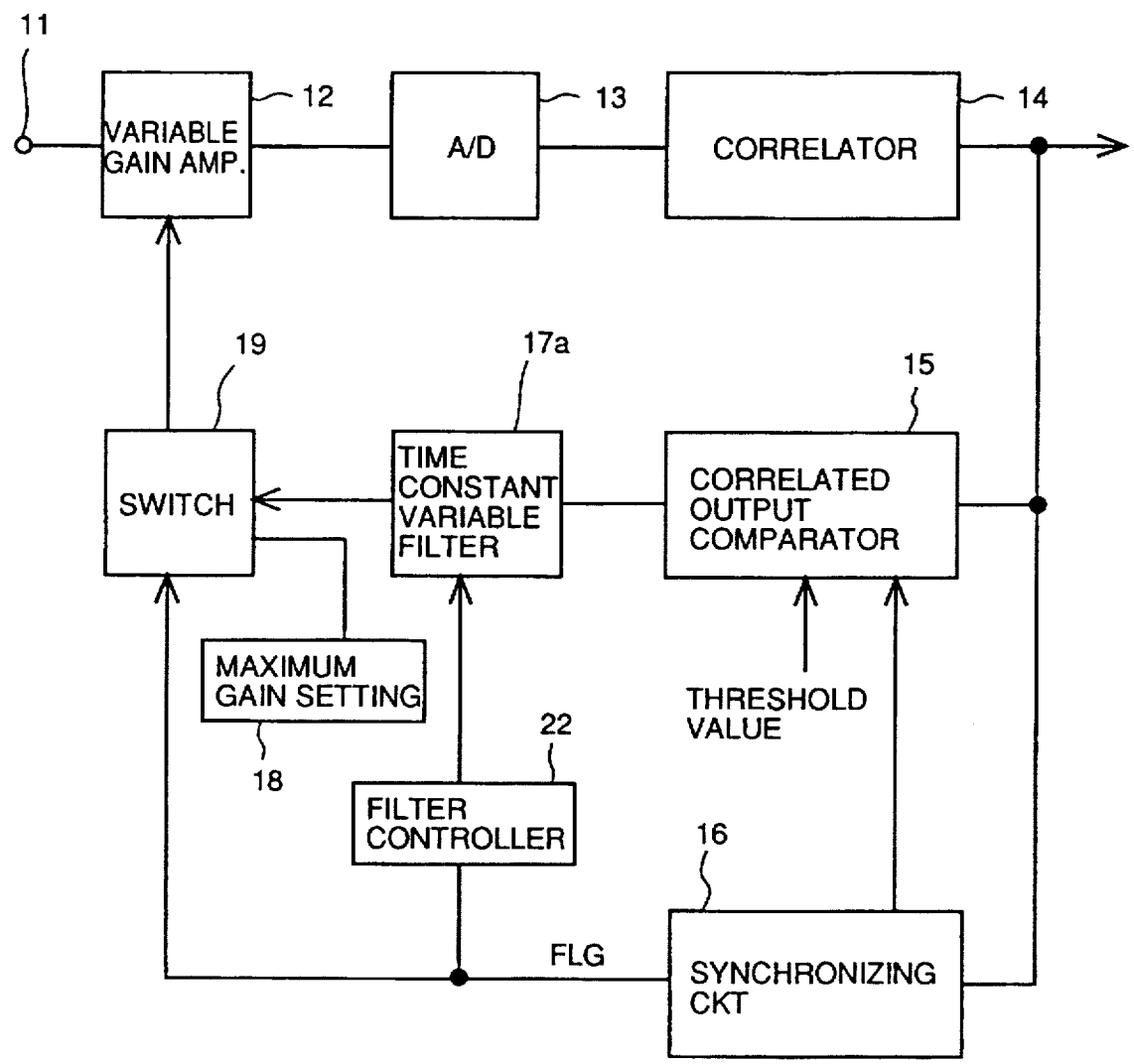
FIG. 11 is a circuit block diagram showing a receiver of a fifth embodiment of the present invention.

Though description was made with reference to FIG. 11, the concept of time constant variable filter 17a and filter controller 22 can be applied to any of the first to fourth embodiments to provide similar effects. Further, the time constant of the filter is switched into two steps in time t3 in the above described embodiment. However, it may be switched in several steps or linearly.

Figure 13:
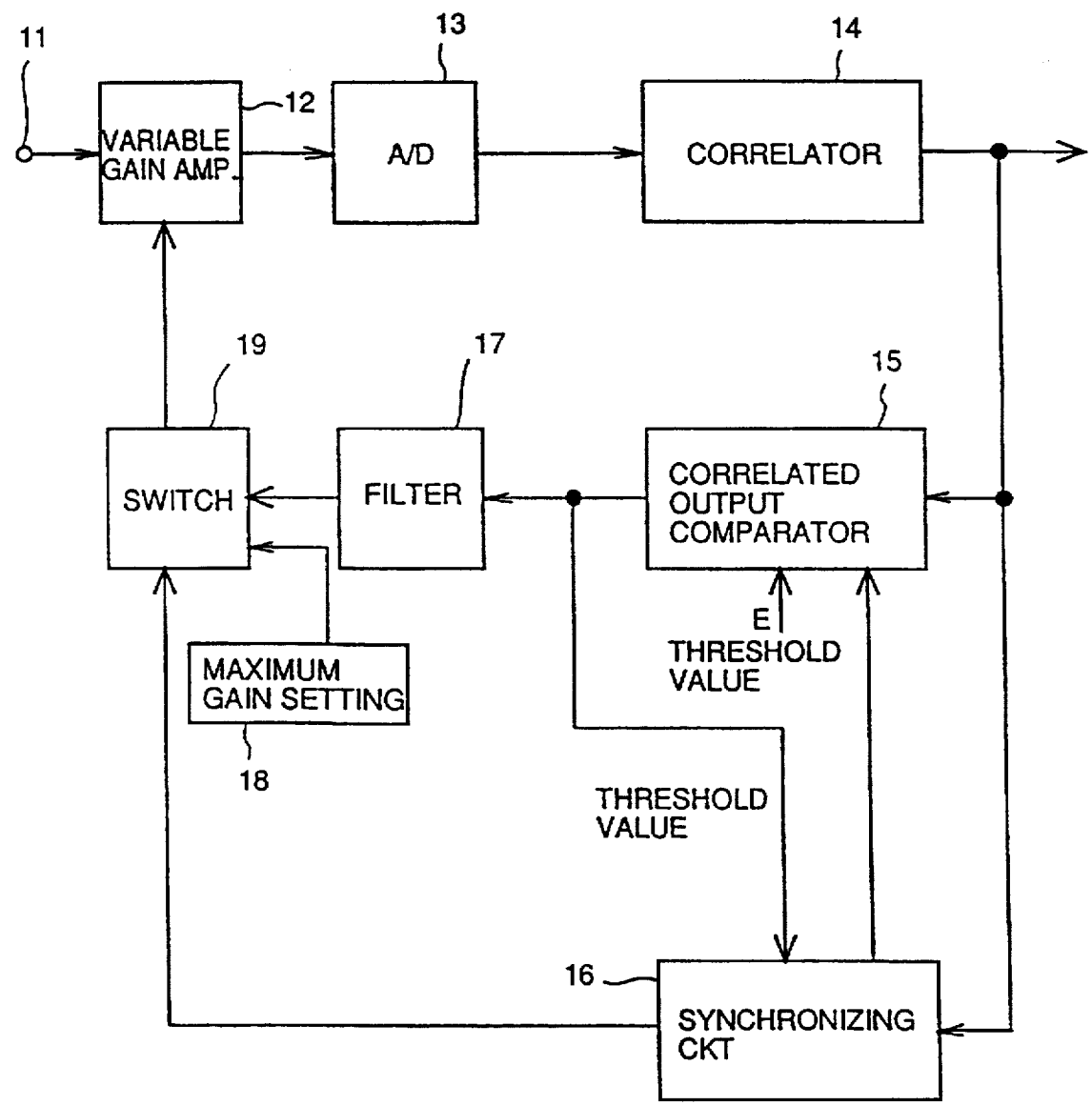
FIG. 13 is a circuit block diagram showing a receiver of a sixth embodiment of the present invention.

A sixth embodiment of the present idescribed ill be described with reference to FIG. 13. In this embodiment, the comparison output from correlated output comparator 15 is applied not only to filter 17 but also to the synchronizing circuit 16.

Figure 14:
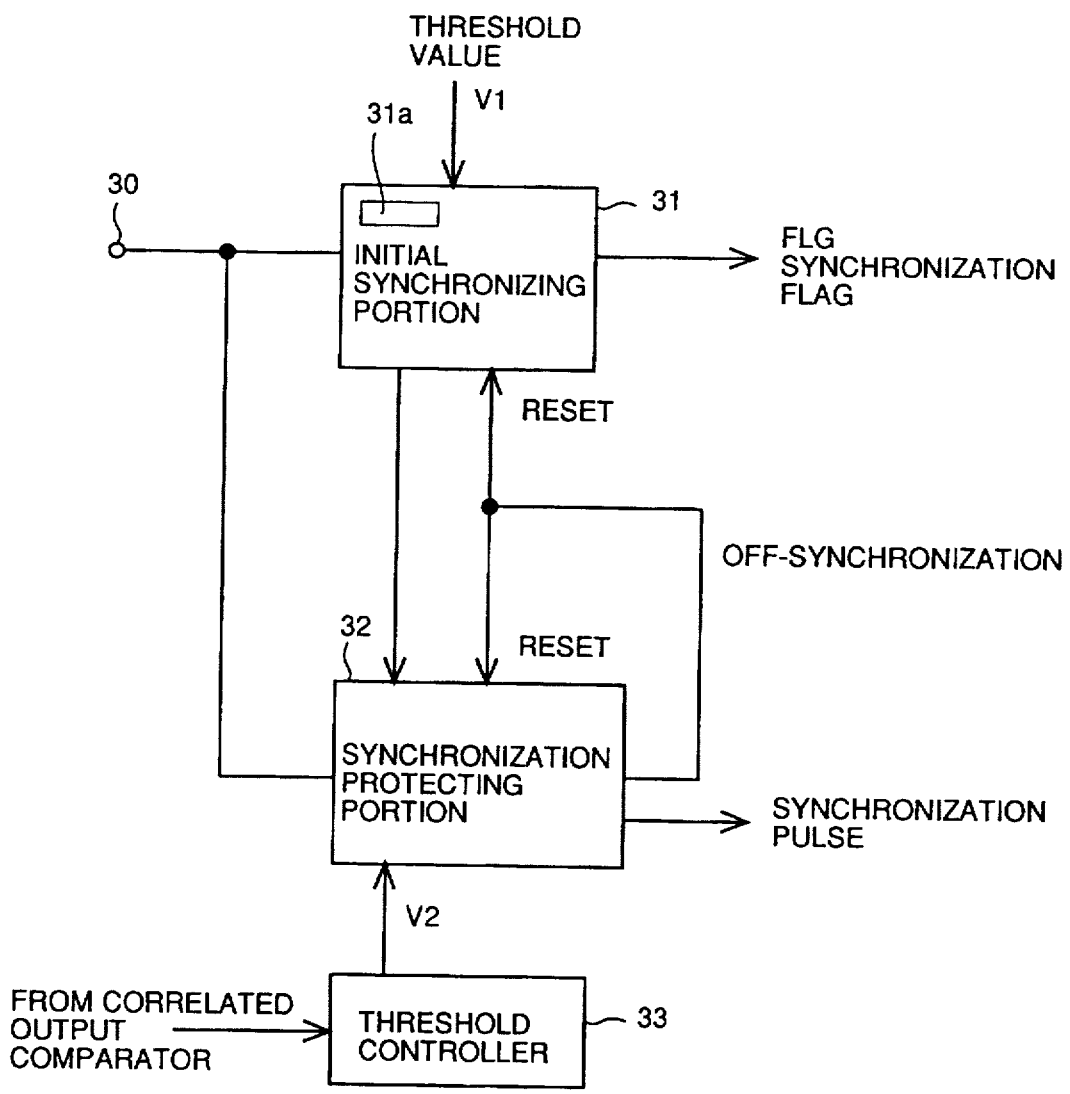
FIG. 14 is a circuit block diagram showing a synchronization circuit of the receiver of FIG. 13.

The structure of synchronizing circuit 16 is shown in FIG. 14. Synchronizing circuit 16 is divided into initial synchronizing portion 31 and synchronization protecting portion 32 to which an output from correlator 14 is applied respectively through a terminal 30. When initial synchronization is established in initial synchronizing portion 31, synchronization flag FLG is output, and synchronization protecting process starts. A comparator 31a is provided in initial synchronizing portion 31 by which the level of the correlated output and a prescribed threshold value V1 are compared. When the correlated output is larger than the threshold value V1, initial synchronizing operation takes place.

When initial synchronization is established, flag FLG is set to "1" and synchronization protecting portion 32 is informed of the establishment of the initial synchronization. Thus synchronization protecting portion 32 maintains synchronization, comparing the correlated output from terminal 30 with a threshold value V2. When synchronization is lost, synchronization protecting portion 32 resets itself and also resets the initial synchronizing portion 31. Thus the flag FLG is set to "0." Initial synchronizing portion 31 again performs initial synchronization so as to set flag FLG to "1."

Figure 15:
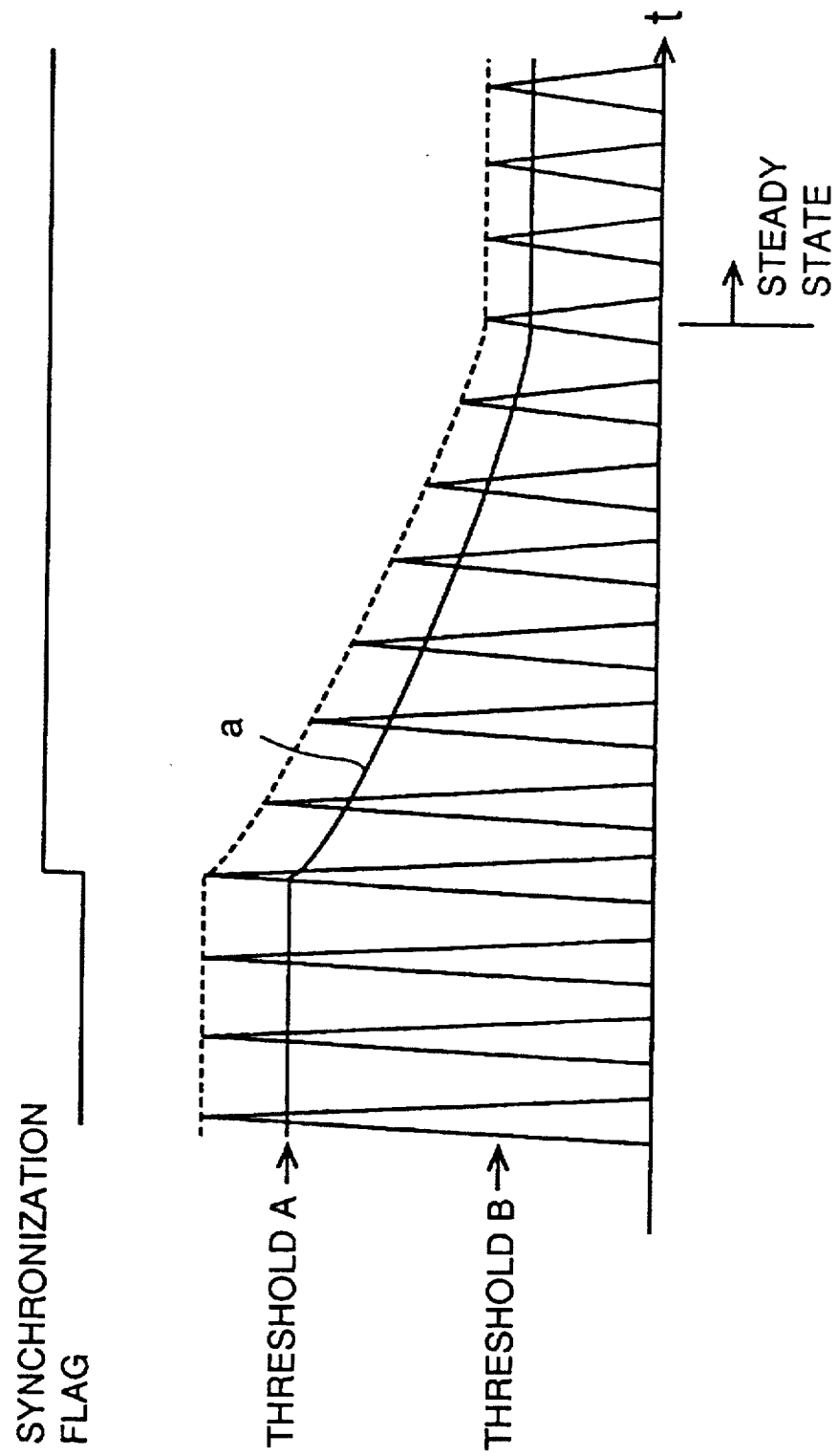
FIG. 15 shows amplitude of the correlated output.

In the synchronizing circuit, separate threshold values are set in initial synchronizing portion 31 and synchronization protecting portion 32, and synchronization is confirmed referring to these threshold values, respectively. Especially in the first to fifth embodiments of the present invention, the gain is maximum at the time of initial synchronization. Therefore, the threshold value is as shown by the threshold value A of FIG. 15, while for protecting synchronization, the threshold value B for the steady state is used.

However, when the operation changes from the initial synchronization to the synchronization protecting state, there is a transitional state as described in the embodiments above. Though means for improvement have been proposed, there is still the transitional state. In that case, synchronization protecting portion 32 regards this transitional state as steady state and performs comparison with the threshold value. Therefore, in the above described embodiments, the protecting operation in the transition state may possibly cause error.

Therefore, in the present embodiment, a threshold controller 33 is provided which determines the threshold value in the transitional state using the value of a signal from correlated output comparator 15, and the threshold value is used as the threshold value V2 for the synchronization protecting portion 32. As a result, the threshold value can be controlled as represented by the solid line a in FIG. 15, and correct synchronization protection becomes possible even in the transitional state.

The control is performed in the following manner, for example. If the threshold value in the steady state corresponds to 80% of the correlated output, then the threshold value is set by multiplying the output from correlated output comparator 15 plus amplitude in the steady state by 80%. For the initial synchronizing portion 31, fixed threshold V1 is used similar to the above. This embodiment is applicable to any of the first to fifth embodiments.

As described above, according to the embodiments of the present invention, means for switching the variable gain amplifier to the maximum gain is provided, and therefore the gain is switched to the maximum value dependent on presence/absence of a synchronization establishment signal from the correlation synchronizing circuit. Accordingly, the signal amplitude at the time of initial synchronization can be kept at the maximum value. Since the gain of the variable amplifier is maximized until initial synchronization is established, initial synchronization can be performed stably with simple structure as compared with the prior art, and the circuit structure can be made simpler as compared with the structure shown in FIG. 3 of the prior art example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A spread spectrum signal receiver, comprising:
   variable gain amplifying means for amplifying a received signal;
   converting means for converting an output signal from said variable gain amplifying means to a digital signal;
   correlating means for finding correlation between the digital signal and a spread code;
   correlation synchronizing means for comparing an output signal from said correlating means with a predetermined threshold value to obtain correlation and synchronization by using the output signal from said correlating means, for performing initial synchronization and for performing synchronization protection after synchronization is established;

gain control means responsive to establishment of synchronization by said correlation synchronizing means for controlling an amplitude level of the output signal of said variable gain amplifying means based on an amplitude of the output signal of said correlating means; and switching means for switching a gain of said variable gain amplifying means to a maximum gain in accordance with presence of a synchronization establishment signal from said correlation means.

2. The spread spectrum signal receiver according to claim 1, further comprising:

holding means for holding an output amplitude of an output signal from said gain control means during synchronization protection as a gain control value, the gain of said variable gain amplifying means being controlled by the gain control value held by said holding means.

3. The spread spectrum signal receiver according to claim 2, further comprising:

means for resetting the gain control value held by said holding means.

4. The spread spectrum signal receiver according to claim 1, further comprising filter means for smoothing an output from said switching means and applying the smoothed output to said variable gain amplifying means.

5. The spread spectrum signal receiver according to claim 1, further comprising filter means for smoothing an output from said gain control means and for applying the smoothed output to said switching means.

6. The spread spectrum signal receiver according to claim 5, wherein said filter has a variable time constant, said receiver further comprising:

filter control means for changing said variable time constant in accordance with time lapse from a timing of establishment of initial synchronization.

7. The spread spectrum signal receiver according to claim 1, wherein said correlation synchronizing means includes:

initial synchronizing means for comparing the output signal from said correlating means and a predetermined first threshold value, for performing an initial synchronizing operation when the output signal from said correlating means is larger than said predetermined first threshold value; and synchronization protecting means, responsive to the initial synchronization operation by said initial synchronizing means, for comparing the output signal from said correlating means with a predetermined second threshold value and for protecting synchronization after synchronization is established when the output signal from said correlating means is larger than predetermined second threshold value.

8. The spread spectrum signal receiver according to claim 7, further comprising threshold value control means, responsive to an output signal from said gain control means, for controlling said predetermined second threshold value of said synchronization protecting means.

9. A method of processing a received signal comprising the steps of:

a) amplifying the received signal using a set gain;

b) converting the amplified signal into a digital signal;

c) correlating the digital signal with a spread code to provide a correlated signal;

d) performing a synchronization procedure for establishing correlated synchronization of the correlated signal at a correlated timing;

e) comparing the correlated signal to a threshold value in accordance with the correlated synchronization established in said step d) to generate a comparison signal indicative of the comparison; and f) selectively setting the gain for amplifying in said step a) as either based on the comparison signal or as a maximum gain in accordance with establishment of correlated synchronization in said step d).

10. The method of processing a received signal of claim 9, wherein said step e) comprises holding the comparison signal during a synchronization protection mode of operation, the gain for amplifying in said step f) based on the comparison signal being set in accordance with the comparison signal held in said step e).

11. The method of processing a received signal of claim 10, wherein said step e) further comprises selectively resetting the held comparison signal.

12. The method of processing a received signal of claim 9, wherein said step e) further comprises smoothing the comparison signal, the gain for amplifying in said step f) based on the comparison signal being set in accordance with the smoothed comparison signal.

13. The method of processing a received signal of claim 12, wherein said step e) comprises filtering the comparison signal with a variable time constant to provide the smoothed comparison signal, the variable time constant being variable in accordance with time lapse from initial establishment of correlated synchronization in said step d).

14. The method of processing a received signal of claim 9, wherein said step d) comprises the steps of:

d1) performing an initial synchronization when the correlated signal is determined as greater than a first predetermined threshold value; and d2) performing synchronization protection, responsive to performance of initial synchronization in said step d1), when the correlated signal is determined as greater than a second predetermined threshold value.

15. The method of processing a received signal of claim 14, wherein synchronization protection in said step d2) occurs after initial synchronization is established in said step d1).

16. The method of processing a received signal of claim 9, wherein said step f) comprises setting the gain in said step a) based on the comparison signal when correlated synchronization is established in said step d) and setting the gain in said step a) as the maximum gain when correlated synchronization cannot be established in said step d).

17. The method of processing a received signal of claim 9, wherein the received signal is a spread spectrum signal.

18. The method of processing a received signal of claim 9, further comprising the step of:

h) smoothing the gain set in said step f) and using the smoothed gain as the set gain in said step a).

19. A signal receiver comprising:

an amplifier which amplifies a received signal using a set gain;

a converter which converts the amplified signal into a digital signal;

a correlator which correlates the digital signal with a spread code to provide a correlated signal;

a synchronizer which performs a synchronization procedure for establishing correlated synchronization of the correlated signal at a correlated timing;

a comparator which compares the correlated signal to a threshold value in accordance with the correlated synchronization established by said synchronizer to generate a comparison signal indicative of the comparison; and a gain setter which selectively sets the gain for said amplifier as either based on the comparison signal or as a maximum gain in accordance with establishment of correlated synchronization by said synchronizer.

20. The signal receiver of claim 19, further comprising:

a holding unit which holds the comparison signal during a synchronization protection mode of operation, the gain for said amplifier based on the comparison signal being set by said gain setter in accordance with the comparison signal held in said holding unit.

21. The signal receiver of claim 20, wherein the holding signal in said holding unit is selectively resettle.

22. The signal receiver of claim 19, further comprising a filter which smoothes the comparison signal, the gain for said amplifier based on the comparison signal being set in accordance with the smoothed comparison signal.

23. The signal receiver of claim 22, wherein said filter filters the comparison signal with a variable time constant to provide the smoothed comparison signal, the variable time constant being variable in accordance with time lapse from initial establishment of correlated synchronization by said synchronizer.

24. The signal receiver of claim 19, wherein said synchronizer comprises:

a first synchronizing unit which performs an initial synchronization when the correlated signal is determined as greater than a first predetermined threshold value; and a second synchronizing unit which performs synchronization protection, responsive to performance of initial synchronization by said first synchronizing unit, when the correlated signal is determined as greater than a second predetermined threshold value.

25. The signal receiver of claim 24, wherein said second synchronizing unit performs synchronization protection after initial synchronization is established by said first synchronizing unit.

26. The signal receiver of claim 19, wherein said gain setter sets the gain of said amplifier based on the comparison signal when correlated synchronization is established by said synchronizer and sets the gain of said amplifier as the maximum gain when correlated synchronization cannot be established by said synchronizer.

27. The signal receiver of claim 19, wherein the received signal is a spread spectrum signal.

28. The signal receiver of claim 19, further comprising:

a filter which smoothes the gain set by said gain setter and provides the smoothed gain as the set gain of said amplifier.

* * * * *